(12) United States Patent
Assefa et al.

(10) Patent No.: US 9,466,740 B2
(45) Date of Patent: *Oct. 11, 2016

(54) INTEGRATED PHOTODETECTOR WAVEGUIDE STRUCTURE WITH ALIGNMENT TOLERANCE

(71) Applicant: INTERNATIONAL BUSINESS MACHINES CORPORATION, Armonk, NY (US)

(72) Inventors: Solomon Assefa, Ossining, NY (US); Bruce W. Porth, Jericho, VT (US); Steven M. Shank, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/963,520

(22) Filed: Dec. 9, 2015

(65) Prior Publication Data

US 2016/0085039 A1    Mar. 24, 2016

Related U.S. Application Data

(60) Continuation of application No. 14/833,542, filed on Aug. 24, 2015, which is a division of application No. 14/148,988, filed on Jan. 7, 2014, now Pat. No. 9,231,131.

(51) Int. Cl.
*H01L 31/18* (2006.01)
*G02B 6/42* (2006.01)
*H01L 31/0232* (2014.01)
(Continued)

(52) U.S. Cl.
CPC ....... *H01L 31/02327* (2013.01); *G02B 6/1228* (2013.01); *G02B 6/136* (2013.01); *G02B 6/42* (2013.01); *G02B 6/4295* (2013.01); *H01L 31/0203* (2013.01); *H01L 31/028* (2013.01); *H01L 31/09* (2013.01); *H01L 31/184* (2013.01); *H01L 31/1808* (2013.01);
(Continued)

(58) Field of Classification Search
CPC ............. H01L 31/02327; H01L 31/1872; H01L 31/1808; H01L 31/028; H01L 31/0203; H01L 31/1864; H01L 31/184; H01L 31/09; Y02P 70/521; G02B 6/1228; G02B 6/4295; G02B 6/42
See application file for complete search history.

(56) References Cited

U.S. PATENT DOCUMENTS 6,978,067 B2    12/2005    Herbert et al.
7,120,350 B2 *  10/2006    Block ............... G02B 6/12004
                                                            385/146
(Continued)

OTHER PUBLICATIONS

Greedy, et al., "Fibre coupling to SiGe optoelectronic devices," IEE Proceedings, Dec. 2000, vol. 147, No. 6, pp. 391-394.
(Continued)

*Primary Examiner* — Svitr Mulpuri
(74) *Attorney, Agent, or Firm* — Steven Meyers; Andrew M. Calderon; Roberts Mlotkowski Safran Cole & Calderon, P.C.

(57) ABSTRACT

An encapsulated integrated photodetector waveguide structures with alignment tolerance and methods of manufacture are disclosed. The method includes forming a waveguide structure bounded by one or more shallow trench isolation (STI) structure(s). The method further includes forming a photodetector fully landed on the waveguide structure.

10 Claims, 5 Drawing Sheets

(51) Int. Cl.
*H01L 31/028* (2006.01)
*G02B 6/122* (2006.01)
*G02B 6/136* (2006.01)
*H01L 31/0203* (2014.01)
*H01L 31/09* (2006.01)

(52) U.S. Cl.
CPC ...... *H01L 31/1864* (2013.01); *H01L 31/1872* (2013.01); *Y02P 70/521* (2015.11)

(56) References Cited

U.S. PATENT DOCUMENTS

| | | | |
|---|---|---|---|
| 7,132,656 | B2 | 11/2006 | Xu et al. |
| 7,266,263 | B2 | 9/2007 | Ahn et al. |
| 7,305,157 | B2 * | 12/2007 | Ahn .................. G02B 6/12004 385/14 |
| 7,515,793 | B2 | 4/2009 | Dehlinger et al. |
| 7,603,016 | B1 | 10/2009 | Soref |
| 7,790,495 | B2 | 9/2010 | Assefa et al. |
| 8,000,565 | B2 | 8/2011 | Liu |
| 8,148,794 | B2 | 4/2012 | Masini et al. |
| 8,178,382 | B2 | 5/2012 | Assefa et al. |
| 8,269,303 | B2 | 9/2012 | Fujikata et al. |
| 8,290,325 | B2 | 10/2012 | Reshotko et al. |
| 8,319,237 | B2 | 11/2012 | Liu |
| 8,373,153 | B2 | 2/2013 | Ahn |
| 8,633,067 | B2 | 1/2014 | Assefa |
| 8,728,850 | B2 | 5/2014 | Ji et al. |
| 8,728,852 | B2 * | 5/2014 | Tatani ................. H01L 27/1463 438/73 |
| 8,859,319 | B2 | 10/2014 | Kim et al. |
| 8,866,187 | B2 | 10/2014 | Na et al. |
| 8,871,554 | B2 | 10/2014 | Hill et al. |
| 8,948,224 | B2 | 2/2015 | Kim et al. |
| 9,048,371 | B2 | 6/2015 | Ang et al. |
| 9,103,972 | B2 | 8/2015 | Budd et al. |
| 2005/0110108 | A1 * | 5/2005 | Patel .................. G02B 6/12004 257/453 |
| 2007/0104410 | A1 * | 5/2007 | Ahn .................. G02B 6/12004 385/14 |
| 2007/0104441 | A1 | 5/2007 | Ahn et al. |
| 2009/0080486 | A1 | 3/2009 | Ju |
| 2009/0101909 | A1 | 4/2009 | Chen |
| 2009/0108384 | A1 * | 4/2009 | Assefa ............... G02B 6/12004 257/432 |
| 2009/0324164 | A1 * | 12/2009 | Reshotko ............. G02B 6/1228 385/14 |
| 2010/0006961 | A1 | 1/2010 | Yasaitis et al. |
| 2011/0012221 | A1 | 1/2011 | Fujikata |
| 2011/0084308 | A1 | 4/2011 | Loh et al. |
| 2011/0133187 | A1 | 6/2011 | Kim et al. |
| 2011/0312443 | A1 | 12/2011 | Sullivan |
| 2012/0025265 | A1 | 2/2012 | Ji et al. |
| 2012/0129302 | A1 | 5/2012 | Assefa et al. |
| 2013/0156057 | A1 | 6/2013 | Kim et al. |

OTHER PUBLICATIONS

Narasimha, et al., "A Fully Integrated 4×10-Gb/s DWDM Optoelectronic Transceiver Implemented in a Standard 0.13 um CMOS SOI Technology," IEEE Journal of Solid-State Circuits, Dec. 2007, vol. 42, No. 12, pp. 2736-2744.

Notice of Allowance dated Mar. 7, 2016 in U.S. Appl. No. 14/833,596, 6 pages.

Office Action dated Mar. 1, 2016 in U.S. Appl. No. 14/833,542, 7 pages.

Notice of Allowance dated May 12, 2016 in U.S. Appl. No. 14/833,639, 10 pages.

* cited by examiner

INTEGRATED PHOTODETECTOR WAVEGUIDE STRUCTURE WITH ALIGNMENT TOLERANCE

FIELD OF THE INVENTION

The invention relates to semiconductor structures and, more particularly, to encapsulated integrated photodetector waveguide structures with alignment tolerance and methods of manufacture.

BACKGROUND

Photosensors or photodetectors are sensors that detect light or other electromagnetic energy. There are several varieties of photosensors or photodetectors, many of which are manufactured using conventional CMOS technologies. For example, photosensors or photodetectors can be active receivers commonly used in photonic integrated circuit (PIC) transceivers. These types of transceivers have emerged as an alternative to transceivers that use discrete opto-electronic components.

Many types of photosensors or photodetectors implement CMOS integrated nanophotonics circuits. These nanophotonics circuits include crystalline materials like germanium or III-V compounds, which are desirable for use as the active element in photodetector components. This is due to their high quantum efficiency. In the manufacturing process, the crystalline materials are encapsulated in order to protect the crystalline structure from other manufacturing processes.

Using rapid melt growth, amorphous or polycrystalline films (e.g., germanium or III-V compounds) can be deposited at low temperatures in an amorphous or polycrystalline state, and then crystallized thermally. This technique provides for a high degree of integration flexibility. During the crystallization anneal, though, the amorphous or polycrystalline material (e.g., Ge) expands and contracts, creating stress on the encapsulation films. These stresses can be exacerbated due to the encapsulation films being formed on non-planar surfaces such as divots formed by processing of shallow trench isolation (STI) structures.

These stresses can create a breach in the encapsulation, resulting in defects that can subsequently degrade the operation of the photodetector. For example, light coupled to extrusions can result in slow diffusion of carriers to contacts, thereby limiting a 3 db bandwidth of the detector.

SUMMARY

In an aspect of the invention, a method comprises forming a waveguide structure bounded by one or more shallow trench isolation (STI) structure(s). The method further comprises forming a photodetector fully landed on the waveguide structure.

In an aspect of the invention, a method comprises forming an optical waveguide having a first lateral boundary and a second lateral boundary, bounded by pull down structures. The method further comprises forming a first encapsulating layer fully landed on the optical waveguide, with a window exposing a surface of the optical waveguide. The method further comprises forming photodetector material within the first lateral boundary and second lateral boundary of the optical waveguide, on the first encapsulating layer and in contact with the surface of the optical waveguide through the window. The method further comprises forming a second encapsulating layer over the photodetector material and within the first lateral boundary and the second lateral boundary of the optical waveguide. The method further comprises crystallizing the photodetector material to form a photodetector fully landed on the optical waveguide.

In an aspect of the invention, a sensor structure comprises: a waveguide structure bounded by one or more shallow trench isolation (STI) structures; and a photodetector fully landed on the waveguide structure, adjacent to the one or more STI structures.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the encapsulated integrated photodetector waveguide structures with alignment tolerance, which comprises the structures of the present invention. In still further embodiments, a method in a computer-aided design system is provided for generating a functional design model of the encapsulated integrated photodetector waveguide structures with alignment tolerance. The method comprises generating a functional representation of the structural elements of the encapsulated integrated photodetector waveguide structures with alignment tolerance.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
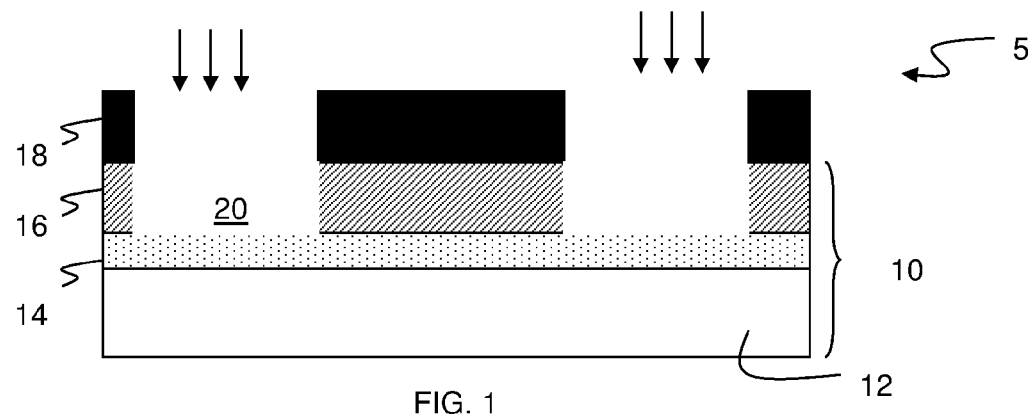
FIGS. 1-4*b* show processing steps and respective structures in accordance with aspects of the present invention.

The invention relates to semiconductor structures and, more particularly, to encapsulated integrated photodetector waveguide structures with alignment tolerance and methods of manufacture. More specifically, the present invention is directed to encapsulated recrystallized amorphous/polycrystalline/polysilicon material sensors and methods of manufacture. In embodiments, the sensors can be any amorphous/polycrystalline/polycrystalline materials such as germanium or III-V compounds which, upon thermal anneal, will crystallize.

Advantageously, the present invention provides sensors that eliminate or substantially reduce defects, which would otherwise be formed during crystallization processes. This is accomplished by forming the sensors fully on a planar surface of the optical waveguide, e.g., underlying silicon material. In this way, the sensors will not be located on any divots, which may be formed at boundaries of STI structures.

By way of background, there is a requirement in silicon photonics to integrate a photodetector and waveguide together, with the photodetector located above the waveguide. There is also a need to generate tapered photodetector shapes to improve light collection efficiency. These shapes, however, create stress during the germanium crystallization, resulting in material extrusions and, in turn, lower 3 db bandwidth due to slow diffusion of photo generated carriers to the contacts. The present invention eliminates or substantially reduces defects in the photodetector by landing the photodetector fully on a planar surface of the optical waveguide, e.g., underlying silicon material. More specifically, in embodiments, the sensors of the present invention are fully landed on silicon, eliminating any overlay issues and therefore eliminating additional stresses which may cause problems of extrusion of germanium or other material.

In embodiments, the photodetector structure of the present invention comprises silicon on insulator (SOI) material forming an optical waveguide having a first side and a second side, bounded by shallow trench isolation (STI) structure(s). A first dielectric layer is deposited on the optical waveguide to encapsulate a bottom surface of a subsequently deposited photodetector material, e.g., Ge material. As should be understood by those of skill in the art, the dielectric layer between the optical waveguide and photodetector material can serve several purposes: (i) it can confine the crystallization seed to a window defined by an opening to SOI in this layer, (ii) it forms a bottom encapsulation layer of the photodetector, and (iii) it is the light coupling layer between the optical waveguide and the photodetector.

The photodetector, which can have a tapered input end or other geometry as described herein, is formed on the first dielectric layer, such that the dimensions of the photodetector lie within a lateral boundary of the optical waveguide. That is, the lateral boundary of the photodetector will not extend onto adjacent STI structures or divots that may be in the STI structures, at a juncture of the STI structures and optical waveguide. A second dielectric layer is formed over the photodetector as an encapsulation layer, such that an interface between the photodetector and the encapsulation layer remains within the lateral boundary of the optical waveguide. The top dielectric layer, e.g., encapsulation layer, is confined within the boundary of the optical waveguide and will land on the bottom encapsulation layer. This configuration prevents extrusions of the photodetector outside the lateral boundary of the waveguide due to added stresses.

The sensors of the present invention can be manufactured in a number of ways using a number of different tools. In general, though, the methodologies and tools are used to form small structures with dimensions in the micrometer scale. The methodologies, i.e., technologies, employed to manufacture the encapsulated sensors of the present invention have been adopted from integrated circuit (IC) technology. For example, the structures of the present invention are built on wafers and are realized in films of material patterned by photolithographic processes on the top of a wafer. In particular, the fabrication of the encapsulated sensors of the present invention uses three basic building blocks: (i) deposition of thin films of material on a substrate, (ii) applying a patterned mask on top of the films by photolithographic imaging, and (iii) etching the films selectively to the mask.

FIGS. 1-4b show processing steps and respective structures in accordance with a first aspect of the present invention. More specifically, FIG. 1 shows a structure 5 comprising an SOI wafer 10. In the SOI wafer implementation, an insulation layer (e.g., BOX) 14 is formed on top of a wafer (bulk substrate) 12, with an active semiconductor layer 16 (e.g., active silicon) formed on the BOX 14. In embodiments, the semiconductor layer 16 is a single crystalline active semiconductor layer.

In embodiments, the constituent materials of the SOI wafer 10 may be selected based on the desired end use application of the semiconductor device. For example, the BOX 14 may be composed of oxide, such as $SiO_2$. Moreover, the single crystalline active semiconductor layer 16 can be comprised of various semiconductor materials, such as, for example, Si, SiGe, SiC, SiGeC, etc. The SOI wafer 10 may be fabricated using techniques well known to those skilled in the art, e.g., oxygen implantation (e.g., SIMOX), wafer bonding, etc.

Still referring to FIG. 1, a resist 18 is formed on the active semiconductor layer 16. The resist 18 is exposed to energy (e.g., light) in order to form a pattern (openings). The active semiconductor layer 16 undergoes a patterning process, e.g., etching process, through the openings to form one or more trenches 20 to the underlying oxide (insulator layer). In embodiments, the trenches 20 can be shallow isolation trenches which define boundaries of the optical waveguide, formed from the active semiconductor layer 16. In embodiments, the resist 18 can be removed by an oxygen ashing process known to those of skill in the art. One or more pad films can also be provided.

Figure 2:
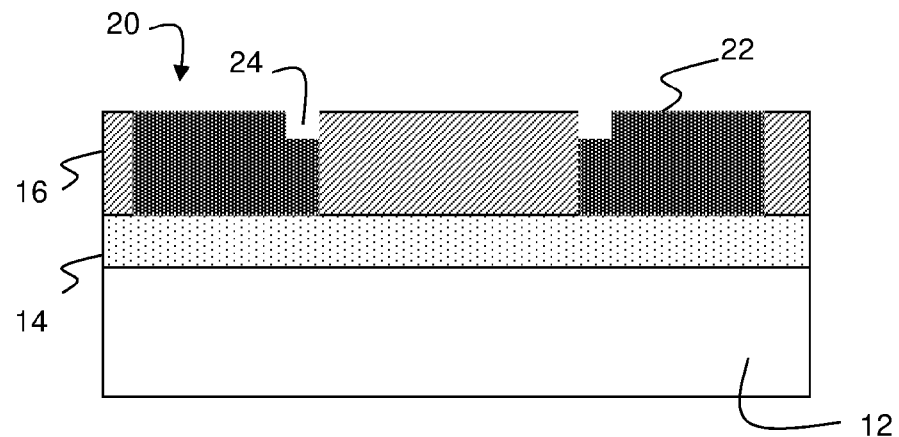

In FIG. 2, the trenches 20 are filled with an insulator material 22. For example, in embodiments, the trenches 20 can be filled with an oxide material to form one or more STI structures. The oxide material can be deposited using conventional deposition processes such as chemical vapor deposition (CVD) processes. Any excess oxide material can be removed by a planarization process. Through various processes, though, divots or recesses (also known as pull downs) 24 form in the STI structure at the junction between the insulator material 22 and the active semiconductor layer 16 (optical waveguide). These divots or recesses 24 can cause unwanted stress on the subsequently formed photodetectors.

Figure 3:
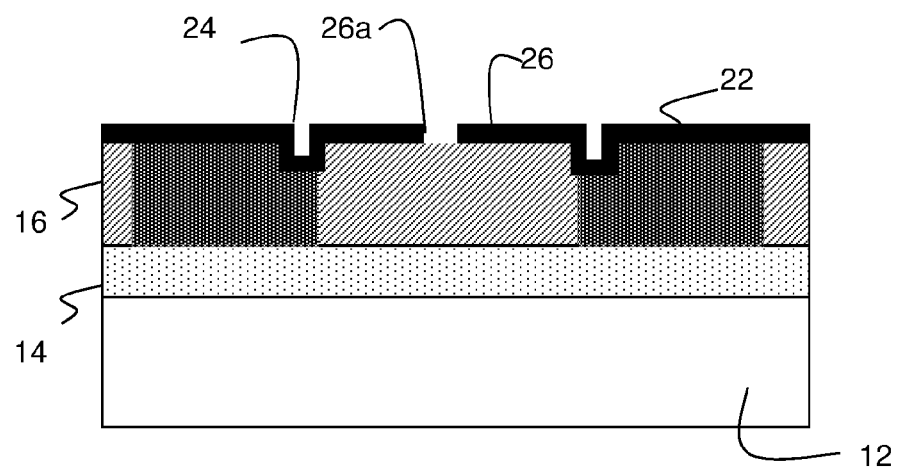

In FIG. 3, an encapsulating material (e.g., dielectric material) 26 is formed on the active semiconductor layer 16, which has a planar surface, as well as the insulator material 22 and divots or recesses 24. In embodiments, the encapsulating material 26 can be nitride, oxide or other hardmask materials deposited using conventional CMOS deposition processes, e.g., CVD processes. In embodiments, the encapsulating material 26 can have a thickness of about 500 Å; although other dimensions are also contemplated by the present invention.

As shown in FIG. 3, in embodiments, the encapsulating material 26 can be patterned using conventional lithography and etching processes. By way of non-limiting illustrative example, a resist formed on the encapsulating material 26 can be exposed to energy (light) to form a pattern (openings). A reactive ion etching (RIE) is performed on the exposed portions of the encapsulating material 26 to pattern the encapsulating material 26. In embodiments, the patterning results in a window or opening 26a which exposes a portion of the underlying semiconductor layer 16 (optical waveguide). In embodiments, the window 26a can be fully landed on the active semiconductor layer 16. The exposed underlying semiconductor layer 16 will act as a seed layer to crystallize amorphous or polycrystalline material, e.g., Ge or other III-V compound material, during subsequent annealing processes. The resist can then be removed by a conventional stripping process, e.g., oxygen ashing.

Figure 4A:
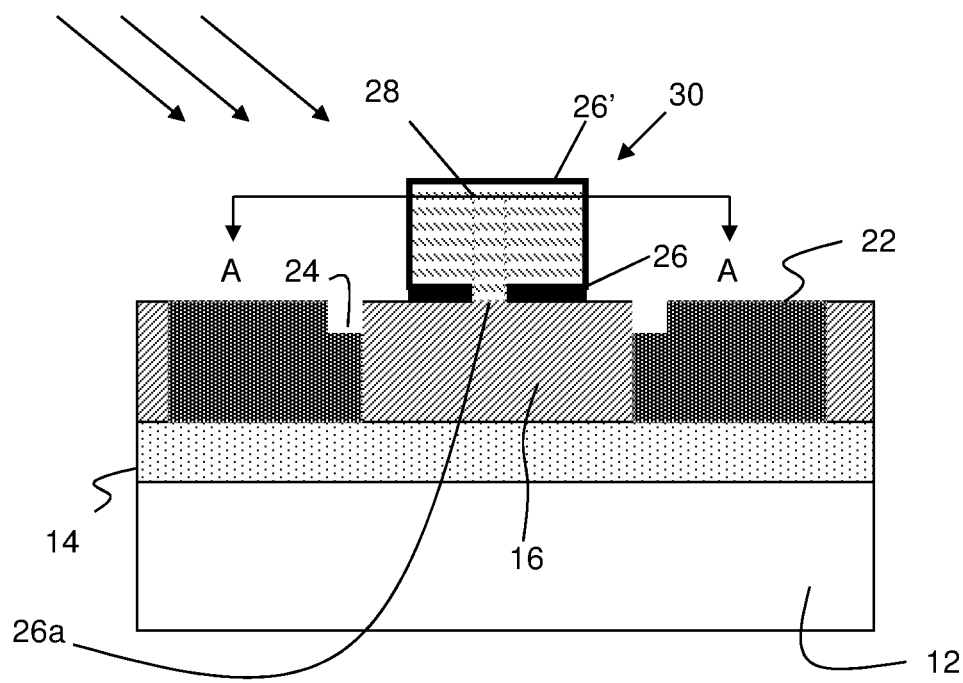
Figure 4B:
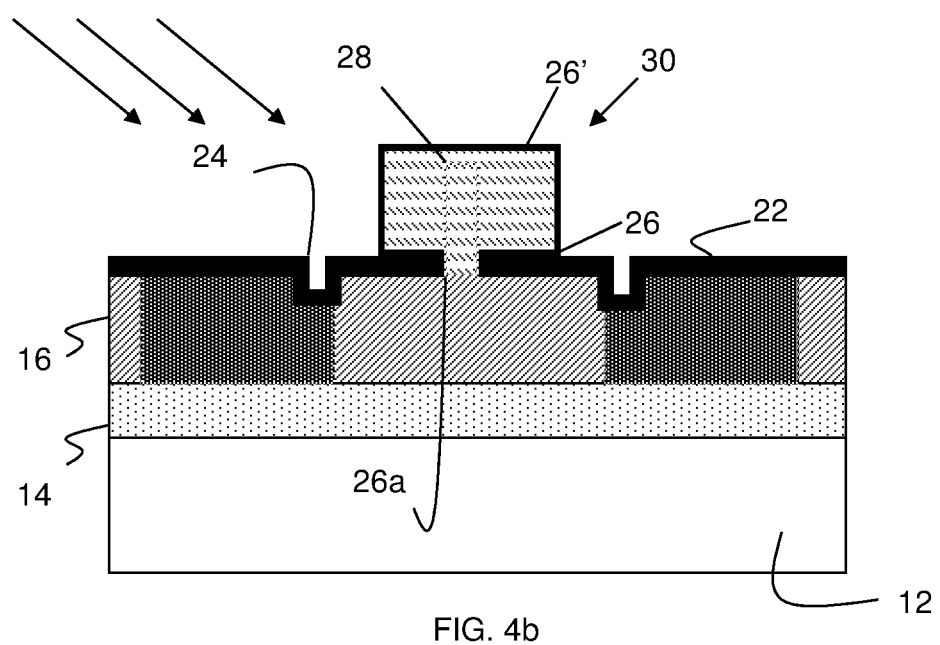

In FIGS. 4a and 4b, amorphous or polycrystalline material 28, e.g., Ge or other III-V compound material, is formed on the encapsulating material 26. More specifically, the amorphous or polycrystalline material 28, e.g., Ge or other III-V compound material, is deposited on the encapsulating material 26 and, if any, exposed underlying semiconductor layer 16. As shown in FIGS. 4a and 4b, the amorphous or polycrystalline material 28, e.g., Ge or other III-V compound material, is patterned to be fully landed on the encapsulating material 26 and, hence, fully landed on the active semiconductor layer 16 (optical waveguide), within the boundaries defined by the divots or recesses 24. That is, the material 28 will be adjacent to, but not contacting, the divots or recesses 24.

As shown in FIG. 4a, the underlying encapsulating material 26 can be further patterned, e.g., etched, so that it is fully landed on the active semiconductor layer 16 (optical waveguide), within the lateral boundaries of the optical waveguide as defined by the divots or recesses 24. In the embodiment shown in FIG. 4a, the encapsulating material 26 will be adjacent to, but not contacting, the divots or recesses 24; however, as shown in FIG. 4b, the underlying encapsulating material 26 can be patterned into different configurations such as, for example, extending onto the encapsulating material 26 and insulator material 22 (and within the divots or recesses 24) or other dimensions contemplated by the present invention. In optional embodiments, the encapsulating material 26 does not need to undergo any additional etching process.

In any of the embodiments, an encapsulating material 26', e.g., nitride, oxide or other hardmask material, is formed over the amorphous or polycrystalline material 28. In embodiments, the encapsulating material 26' will land adjacent to or on the encapsulating material 26, to fully seal the material 28. The encapsulating material 26' will also land fully on and within the confines of the active semiconductor layer 16 (optical waveguide). The encapsulating material 26' can have a thickness of about 500 Å; although other dimensions are also contemplated by the present invention.

As further shown in FIGS. 4a and 4b, the amorphous or polycrystalline material 28 undergoes an annealing process (shown by the arrows) above the melting temperature of the material 28, e.g., about 950° C. for Ge. As should be understood by those of skill in the art, the annealing process will melt and crystallize the amorphous or polycrystalline material 28 thereby forming a photodetector 30, which is now fully landed on a planar surface of the active semiconductor layer 16. The anneal process can also be used to anneal source and drain regions, thereby reducing processing steps and manufacturing costs. As the photodetector 30 is fully landed on a planar surface of the active semiconductor layer 16, e.g., within the lateral boundaries of the optical waveguide as defined by the divots or recesses 24, the present invention is capable of significantly reducing stress and overlay issues.

FIGS. 5-9 show various structures and related processing steps in accordance with various aspects of the present invention. In each of these structures, the encapsulated material 28, e.g., photodetector 30, is fully landed on the active semiconductor layer 16, e.g., optical waveguide structure. That is, the photodetector 30 is within the lateral boundaries of the optical waveguide as defined within the confines of the divots or recesses 24. This ensures that the photodetector 30 is fully landed on a planar surface, thereby reducing or eliminating stress that would otherwise be imposed on the photodetector. As should be understood by those of skill in the art, each of the structures formed in FIGS. 5-9 can be fabricated using conventional CMOS processes as described herein.

Figure 5:
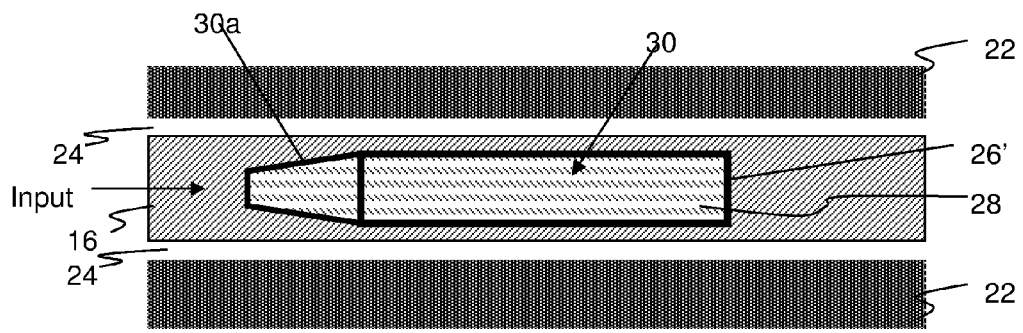
FIGS. 5-9 show various structures and related processing steps in accordance with various aspects of the present invention.

In FIG. 5, the photodetector 30 includes a tapered input end 30a. In embodiments, the tapered input end portion 30a is a narrowed portion which focuses light into the body of the photodetector 30. As in all aspects of the present invention, the photodetector 30 (with the tapered input end 30a) is fully landed on the planar surface of the optical waveguide 16. In this way, the present invention, e.g., photodetector 30, increases operation bandwidth and responsivity.

Figure 6:
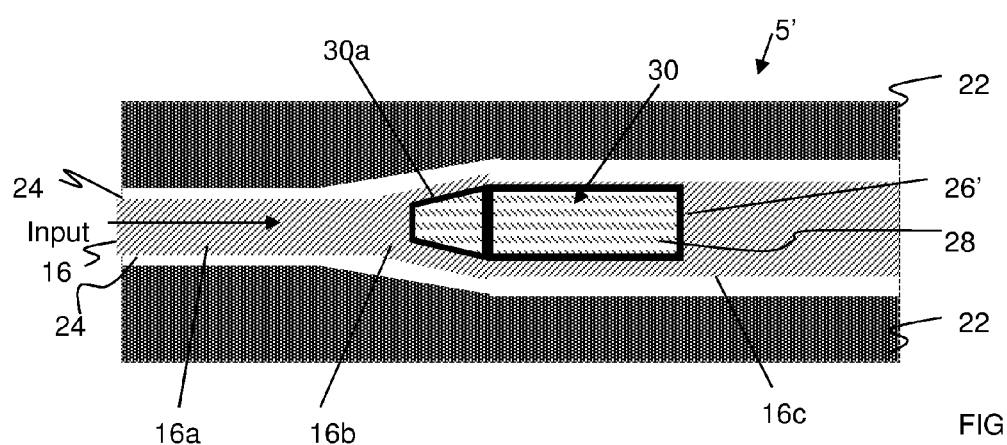

FIG. 6 shows a multi-mode structure 5' which allows for displacement of optical mode and contacts (not shown) to improve detector responsivity (e.g., less light is scattered or absorbed by contacts prior to creating electron-hole pairs). In this implementation, the active semiconductor region (optical waveguide) 16 includes a narrow portion 16a, a tapered portion 16b and a wide portion 16c. In embodiments, the dimensions of the portions 16a, 16b and 16c can vary, depending on the intensity and the wavelength of light. For example, the width of the narrow portion 16a can be about 0.3 microns and the width of the wide portion 16c can be about 1.0 microns. This implementation also includes the photodetector 30 with a tapered input end 30a, fully landed on the planar surface of the optical waveguide 16. In embodiments, the photodetector 30 with tapered input end 30a is shown to be landed on the tapered portion 16b and wide portion 16c of the optical waveguide 16; although other configurations are also contemplated by the present invention.

Figure 7:
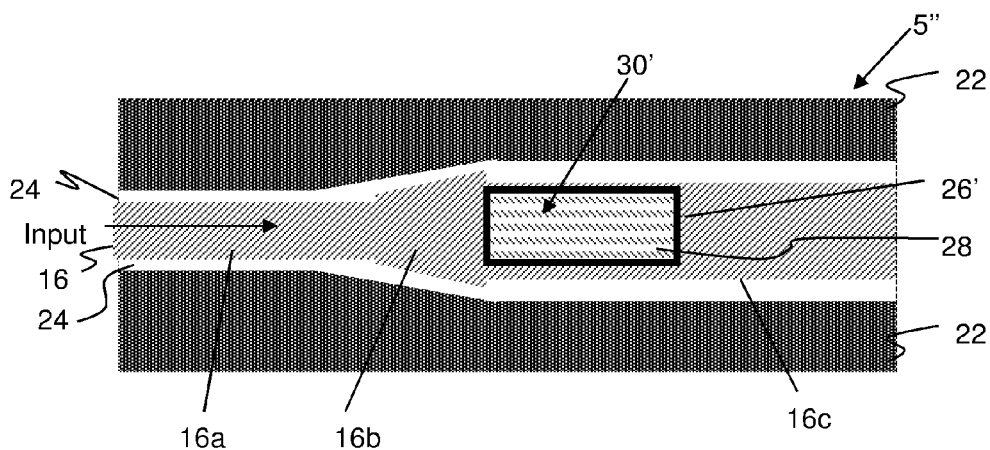

In FIG. 7, the multi-mode structure 5" includes the active semiconductor region (optical waveguide) 16 with a narrow portion 16a, a tapered portion 16b and a wide portion 16c, as described above; whereas, the photodetector 30' is now formed without a tapered input end. In this embodiment, the photodetector 30' is fully landed on the planar surface of the optical waveguide 16, preferably on the wide portion 16c; although other configurations are also contemplated by the present invention.

Figure 8:
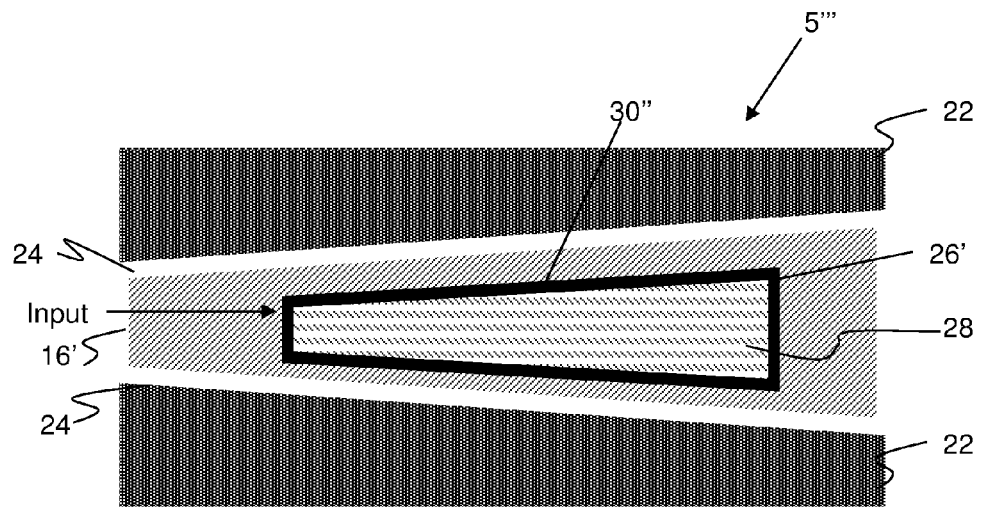

In FIG. 8, the multi-mode structure 5'" comprises an active semiconductor region (optical waveguide) 16' and photodetector 30" both being continuously tapered, e.g., fully tapered. In this implementation, the tapered photodetector 30" is fully landed on the planar surface of the tapered optical waveguide 16'.

Figure 9:
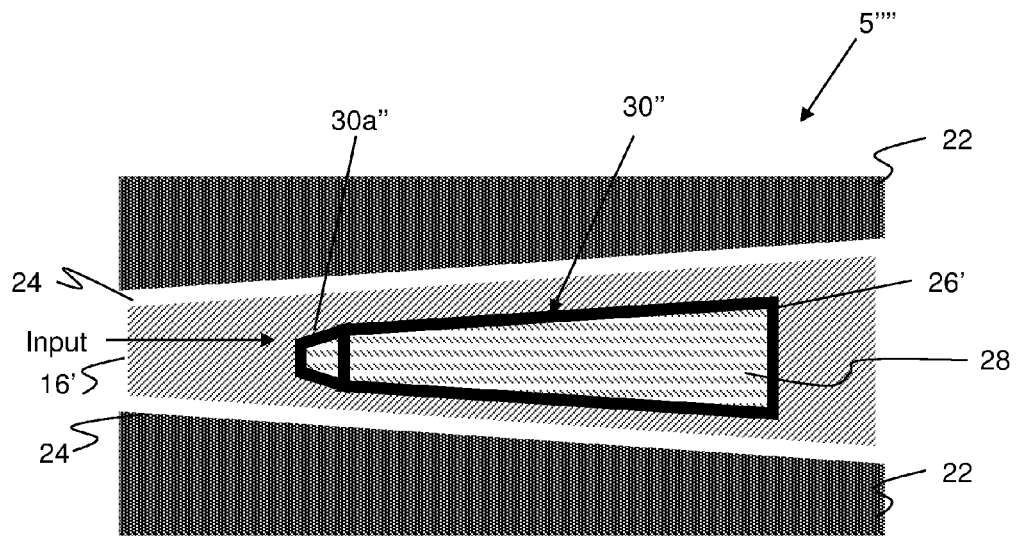

In FIG. 9, the multi-mode structure 5"" comprises a continuously tapered active semiconductor region (optical waveguide) 16', and a double (multiple) tapered photodetector 30". In this implementation, the tapered photodetector 30" includes a further taper at its input end portion as designated by reference numeral 30a". This configuration forms a multiple tapered photodetector. As in previous embodiments, the tapered photodetector 30" (with tapered input end portion 30a") is fully landed on the planar surface of the optical waveguide 16'.

Figure 10:
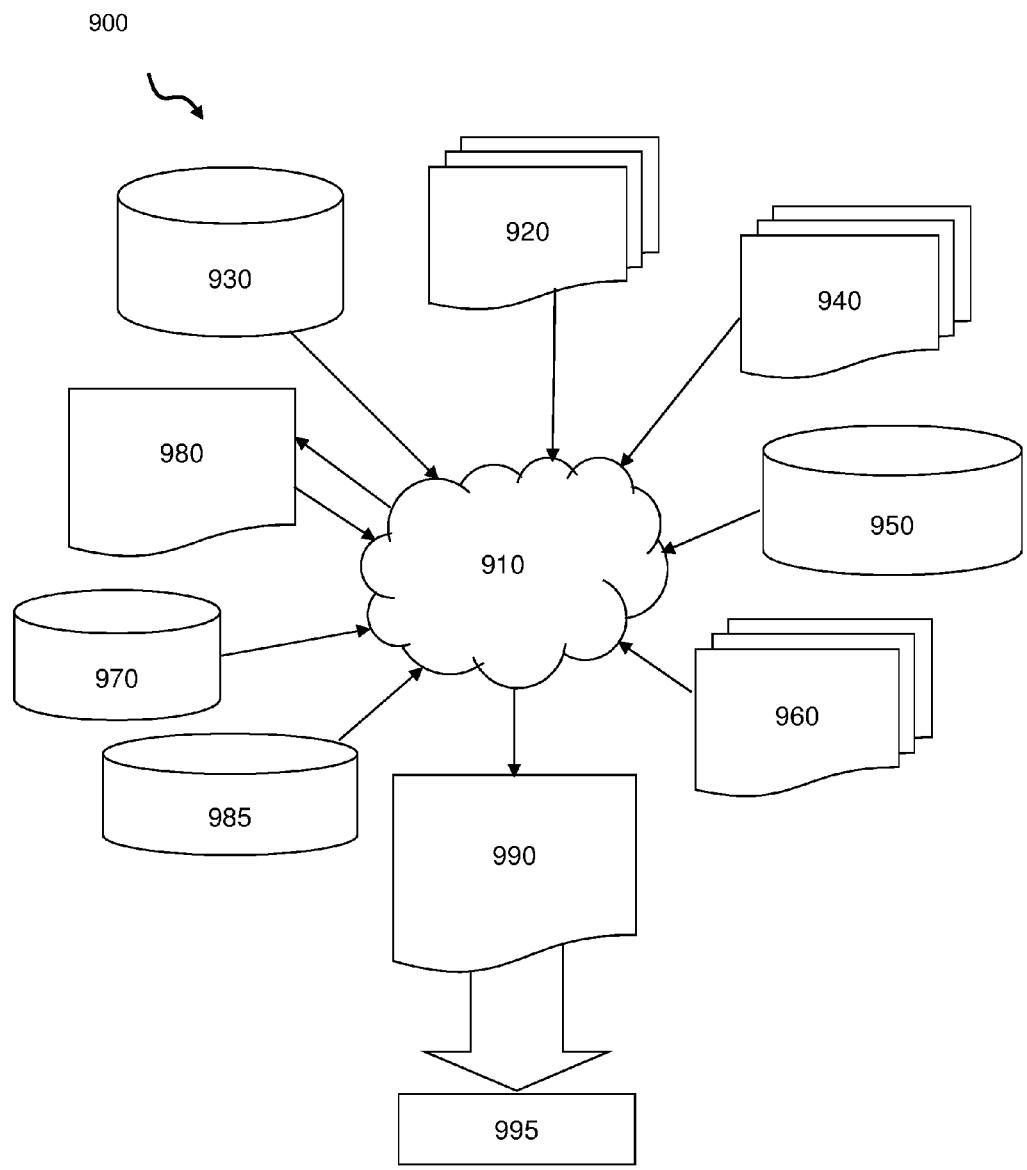
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9.

Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a waveguide structure bounded by one or more shallow trench isolation (STI) structure(s); and
   forming a photodetector fully landed on the waveguide structure,
   wherein the forming the photodetector comprises:
   forming an encapsulating material with a window exposing a portion of the waveguide structure;
   forming sensor material on the encapsulating material and the exposed portion of the waveguide structure;
   forming an upper encapsulating material on the sensor material and landing on the encapsulating material to seal the sensor material; and
   crystallizing the sensor material through an annealing process,
   wherein the encapsulating material, the sensor material and the upper encapsulating material are formed within lateral boundaries of the waveguide structure.

2. The method of claim 1, wherein the waveguide structure is formed from silicon material or silicon on insulator material.

3. The method of claim 1, wherein the forming of the waveguide structure comprises:
   patterning silicon based material to form one or more trenches extending to an underlying insulator layer; and
   forming insulator material in the one or more trenches to form the STI structure(s).

4. The method of claim 1, wherein the photodetector is formed with a non-tapered input end.

5. The method of claim 1, wherein the photodetector and the waveguide structure are formed as continuously tapered structures.

6. The method of claim 1, wherein the waveguide structure is formed as a continuously tapered structure and the photodetector is formed as a multiple tapered structure, with a tapered input end.

7. A method comprising:
   forming a waveguide structure bounded by one or more shallow trench isolation (STI) structure(s); and
   forming a photodetector fully landed on the waveguide structure,
   wherein the forming the photodetector comprises:
   forming an encapsulating material with a window exposing a portion of the waveguide structure;
   forming sensor material on the encapsulating material and the exposed portion of the waveguide structure;
   forming an upper encapsulating material on the sensor material and landing on the encapsulating material to seal the sensor material; and
   crystallizing the sensor material through an annealing process,
   wherein the sensor material and the upper encapsulating material are formed within lateral boundaries of the waveguide structure and the encapsulating material is formed outside the lateral boundaries of the waveguide structure.

8. The method of claim 1, wherein the photodetector comprises amorphous materials which, upon thermal anneal, will crystallize.

9. The method of claim 1, wherein the photodetector comprises polycrystalline material which, upon thermal anneal, will crystallize.

10. The method of claim 1, wherein the photodetector comprises germanium or III-V compounds which, upon thermal anneal, will crystallize.

* * * * *